United States Patent [19]
Miller et al.

[11] Patent Number: 6,155,699
[45] Date of Patent: Dec. 5, 2000

[54] EFFICIENT PHOSPHOR-CONVERSION LED STRUCTURE

[75] Inventors: Jeffrey N. Miller, Los Altos Hills; Danny E. Mars, Los Altos, both of Calif.

[73] Assignee: Agilent Technologies, Inc., Palo Alto, Calif.

[21] Appl. No.: 09/268,764

[22] Filed: Mar. 15, 1999

[51] Int. Cl.[7] .................................................. H04N 9/31
[52] U.S. Cl. ........................ 362/293; 362/800; 362/84; 257/95; 257/97; 257/99; 313/113; 313/512; 313/502
[58] Field of Search .................................... 362/293, 800, 362/84; 313/506, 502, 512, 112, 113, 114; 257/81, 94, 97, 99, 680, 91, 113, 95

[56] References Cited

U.S. PATENT DOCUMENTS

| | | | |
|---|---|---|---|
| 4,822,144 | 4/1989 | Vriens | 362/84 |
| 4,882,617 | 11/1989 | Vriens | 362/293 |
| 5,557,115 | 9/1996 | Shakuda | 257/81 |
| 5,813,752 | 9/1998 | Singer et al. | 362/293 |
| 5,813,753 | 9/1998 | Vriens et al. | 362/293 |
| 5,962,971 | 10/1999 | Chen | 313/512 |
| 5,977,612 | 11/1999 | Bour et al. | 257/618 |

Primary Examiner—Thomas M. Sember

[57] ABSTRACT

A light emitting device and a method of fabricating the device include a wavelength selective reflector that is formed between a light source and a layer of phosphorescent material. The light emitting device is a phosphor-conversion light emitting diode (LED) that outputs secondary light that is converted from primary light emitted from the light source. In the preferred embodiment, the light source is a Gallium Nitride (GaN) die and the wavelength selective reflector is a distributed Bragg reflector (DBR) mirror. The DBR mirror is comprised of multiple alternating layers of high and low refractive index materials. The high refractive index material may be Titanium Dioxide ($TiO_2$) and the low refractive index material may be Silicon Dioxide ($SiO_2$). An encapsulating layer over the GaN die provides a distance between the GaN die and the DBR mirror. Preferably, the encapsulating layer is a dome-shaped structure and the DBR mirror forms a dome-shaped shell over the encapsulating layer. In the most preferred embodiment, the dome-shaped configuration of the encapsulating layer and the DBR mirror is generally hemispheric. The dome-shaped configuration of the DBR mirror reduces the cone-angle average of the primary light from the light source, thereby improving the transmittance characteristic of the DBR mirror with respect to the primary light. Consequently, the amount of output light generated by the LED is significantly improved.

20 Claims, 6 Drawing Sheets

EFFICIENT PHOSPHOR-CONVERSION LED STRUCTURE

TECHNICAL FIELD

The invention relates generally to light emitting diodes and more particularly to a phosphor-conversion light emitting diode.

DESCRIPTION OF THE RELATED ART

Light emitting diodes (LEDs) are well-known solid state devices that can generate light having a peak wavelength in a specific region of the light spectrum. LEDs are typically used as illuminators, indicators and displays. Traditionally, the most efficient LEDs emit light having a peak wavelength in the red region of the light spectrum, i.e., red light. However, a type of LED based on Gallium Nitride (GaN) has recently been developed that can efficiently emit light having a peak wavelength in the blue region of the spectrum, i.e., blue light. This new type of LED can provide significantly brighter output light than traditional LEDs.

In addition, since blue light has a shorter peak wavelength than red light, the blue light generated by the GaN-based LEDs can be readily converted to produce light having a longer peak wavelength. It is well known in the art that light having a first peak wavelength (the "primary light") can be converted into light having a longer peak wavelength (the "secondary light") using a process known as phosphorescence. The phosphorescent process involves absorbing the primary light by a photoluminescent phosphor material, which excites the atoms of the phosphor material, and emitting the secondary light. The peak wavelength of the secondary light will depend on the phosphor material. The type of phosphor material can be chosen to yield secondary light having a particular peak wavelength. An LED that utilizes the phosphorescent process will be defined herein as a "phosphor-conversion LED."

Figure 1:
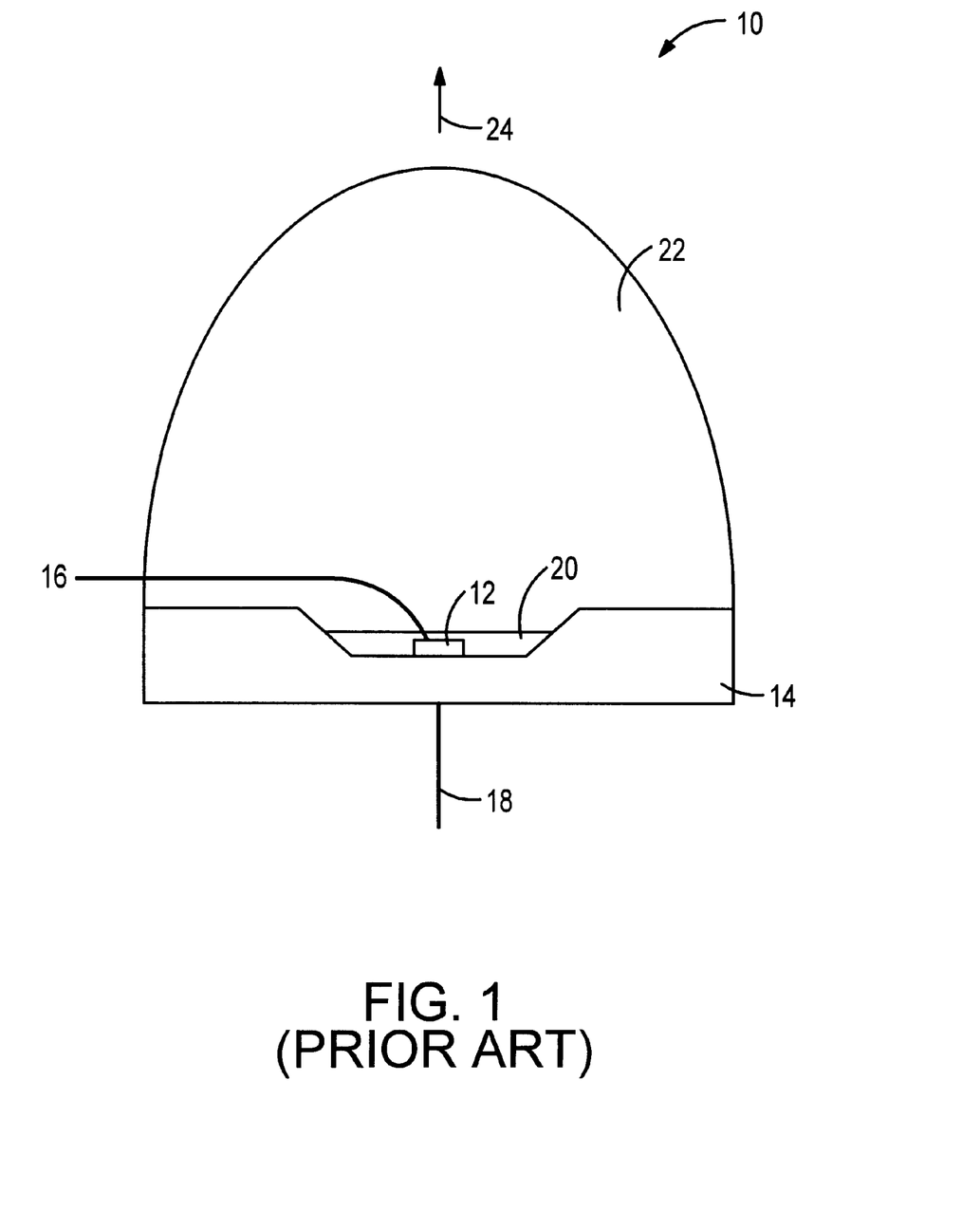
FIG. 1 is a diagram of a prior art phosphor-conversion light emitting diode (LED).

With reference to FIG. 1, a prior art phosphor-conversion LED 10 is shown. The LED 10 includes a GaN die 12 that generates blue primary light when activated. The GaN die 12 is positioned on a reflector cup lead frame 14 and is electrically coupled to leads 16 and 18. The leads 16 and 18 provide electrical power to the GaN die 12. The GaN die 12 is covered by a region 20 of phosphorescent material. The type of phosphorescent material utilized to form the region 20 can vary, depending upon the desired color of secondary light that will be generated by the region 20. The GaN die 12 and the phosphorescent region 20 are encapsulated by a lens 22. The lens 22 is typically made of a transparent epoxy.

In operation, electrical power is supplied to the GaN die 12 to activate the GaN die. When activated, the GaN die 12 emits the primary light, i.e., blue light, away from the top surface of the GaN die 12. The emitted primary light is absorbed by the phosphorescent region 20. The phosphorescent region 20 then emits secondary light, i.e., the converted light having a longer peak wavelength, in response to absorption of the primary light. The secondary light is emitted randomly in various directions by the phosphorescent region 20. Some of the secondary light is emitted away from the GaN die 12, propagating through the lens 22 and exiting the LED 10 as output light. The lens 22 directs the output light in a general direction indicated by arrow 24.

However, some of the secondary light is emitted from the phosphorescent region 20 toward the GaN die 12. The amount of secondary light that is emitted toward the GaN die 12 may be as much as half of the generated secondary light. Much of this light is then absorbed by the GaN die 12 and contact metals. Therefore, the amount of secondary light that eventually escapes the LED 10 as output light is significantly reduced. The maximum external conversion efficiency of typical prior art LEDs, such as the LED 10, has been estimated to be about 60%. The maximum external conversion efficiency is the percentage of output light with respect to the emitted primary light.

U.S. Pat. No. 5,813,752 to Singer et al. describes a phosphorconversion LED that includes a "short wave pass" (SWP) filter to mitigate the above-described cause of inefficiency. The Singer et al. LED is virtually identical to the LED 10, except that the SWP filter is positioned on the upper surface of the GaN die 12, sandwiched between the GaN die 12 and the phosphorescent region 20. The SWP filter transmits the primary light from the GaN die 12, but reflects the secondary light emitted from the phosphorescent region 20. Therefore, the portion of secondary light that is emitted toward the GaN die 12 from the phosphorescent region 20 is reflected by the SWP filter and transmitted through the lens 22, contributing to the total output light. The reflecting of the secondary light by the SWP filter is designed to increase external conversion efficiency.

A concern with the Singer et al. LED is that the SWP filter does not have well-behaved transmittance and reflectance characteristics to efficiently transmit and reflect the primary light and the secondary light over a range of angles, respectively. Ideally, the SWP filter should operate to transmit all of the primary light from the GaN die 12 to the phosphorescent region 20 and reflect all of the secondary light that is emitted back toward the GaN die 12 from the phosphorescent region 20. The concern stems from the fact that the emitted primary light impinges upon the SWP filter with a large range of incident angles. The incident angle is the angle measured from the propagating direction of the incident light to the normal, a perpendicular line with respect to the surface of the SWP filter. The SWP filter exhibits an angle dependency, and the large range of incident angles results in undesirable transmittance and reflectance characteristics. In particular, the SWP filter reflects a significant portion of the primary light emitted from the GaN die 12. Therefore, that portion of the emitted primary light will not be transmitted through the SWP filter to the phosphorescent region 20. The decrease in the amount of primary light transmitted through the SWP filter consequently decreases the amount of primary light that can be converted by the phosphorescent region 20. Thus, the amount of secondary light generated by the phosphorescent region 20 is also reduced. The overall effect is that the amount of output light from the Singer et al. LED has been reduced by the less than optimal rate of transmittance of the SWP filter.

What is needed is a phosphor-conversion LED structure that can efficiently convert the emitted primary light into the secondary light and transmit much of that secondary light as output light of the LED.

SUMMARY OF THE INVENTION

A light emitting device and a method of fabricating the device include a wavelength selective reflector that is formed between a light source and a layer of phosphorescent material. The relative positions and/or shapes of these three elements are selected to enhance device efficiency. The light emitting device is a phosphor-conversion light emitting diode (LED) that outputs secondary light that is converted from primary light emitted by the phosphorescent layer. The wavelength selective reflector operates to transmit the emitted primary light, while preventing the converted secondary light from propagating back to the light source. Thus, the wavelength selective reflector functions as an anti-reflective layer for the emitted primary light. The operation of the wavelength selective reflector increases the light output of the LED by allowing a high percentage of the primary light to reach the phosphorescent layer for conversion and by reflecting much of the converted secondary light that is emitted toward the light source, thereby preventing absorption of the reflected secondary light by the light source.

The phosphor-conversion LED includes the light source, an encapsulating layer that protects the light source, the wavelength selective reflector, the phosphorescent layer and a lens. The wavelength selective reflector is formed over the encapsulating layer, while the phosphorescent layer is formed over the wavelength selective reflector. In the preferred embodiment, the light source of the phosphor-conversion LED is a Gallium Nitride (GaN) die that emits the primary light having a peak wavelength in the blue region of the light spectrum. In addition, the wavelength selective reflector is a distributed Bragg reflector (DBR) mirror. The DBR mirror is comprised of multiple alternating layers of high and low refractive index materials. As an example, the high refractive index material may be Titanium Dioxide ($TiO_2$) and the low refractive index material may be Silicon Dioxide ($SiO_2$). Each high refractive index layer and an adjacent low refractive index layer form a pair of high and low refractive index layers. The number of high and low refractive index layers can vary, depending upon the desired transmittance and reflectance characteristics of the DBR mirror. For example, the DBR mirror may include five pairs of the high and low refractive index layers. The order of the high and low refractive index layers is not critical to the invention.

In this preferred embodiment, the encapsulating layer is a dome-shaped structure that covers the GaN die. Consequently, the DBR mirror forms a dome-shaped shell over the encapsulating layer. Furthermore, the phosphorescent layer may also form a dome-shaped shell attached to the outer surface of the DBR mirror. In the most preferred embodiment, the dome-shaped configuration of the encapsulating layer and the DBR mirror is generally hemispheric. The encapsulating layer is made of a transparent material, such as clear epoxy or glass. The encapsulating layer may remain a generally uniform distance between the GaN die and the DBR mirror. Preferably, the distance is at least three times the length of the GaN die.

In operation, the GaN die of the LED is activated by electrical power that is supplied to the GaN die by two leads. When activated, the GaN die emits the primary light away from the top surface of the GaN die. The emitted primary light propagates through the encapsulating layer toward the DBR mirror. The emitted primary light then impinges upon the DBR mirror. The DBR mirror allows much of the primary light to be transmitted through the DBR mirror to the phosphorescent layer. The amount of primary light transmitted through the DBR mirror depends on the transmittance characteristic of the DBR mirror. Moving the DBR mirror some distance away from the GaN die decreases the range of incident angles. The small range of incident angles increases the transmittance of the primary light.

The transmitted primary light is then absorbed by the phosphorescent layer. The phosphorescent layer emits the secondary light in random directions in response to the absorption of the primary light. Some of the secondary light is emitted away from the DBR mirror and propagates through the lens of the LED, exiting the LED as output light. The lens operates to direct the output light in a general direction defined by a perpendicular line with respect to the upper surface of the GaN die. However, some of the secondary light is emitted back toward the GaN die, impinging upon the DBR mirror. The DBR mirror reflects much of this secondary light, preventing the secondary light from entering the encapsulating layer and being absorbed by the GaN die and surrounding materials. The reflected secondary light then propagates through the lens, exiting the LED as output light.

The method of fabricating the phosphor-conversion LED in accordance with the present invention includes a step in which a light source is provided that emits primary light having a first peak wavelength. Preferably, the light source is a GaN die that emits blue light. Next, a first layer of transparent material is deposited over the light source. The transparent material may be clear epoxy. In the preferred embodiment, the first layer of transparent material is shaped into a dome-shaped structure that encapsulates the light source. After depositing the first layer of transparent material, a distributed Bragg reflector (DBR) mirror is formed over the first layer of transparent material. The DBR mirror conforms to the upper surface of the transparent material, forming a shell over the first layer of transparent material. Since the first layer of transparent material is dome-shaped, the DBR mirror becomes a dome-shaped shell. In the most preferred embodiment, the dome-shaped configuration of the first layer of transparent material and the DBR mirror is generally hemispheric. The DBR mirror is formed by depositing layers of high and low refractive index materials in an alternating fashion. As an example, the high refractive index material may be Titanium Dioxide ($TiO_2$) and the low refractive index material may be Silicon Dioxide ($SiO_2$). The order in which the layers of high and low refractive index materials are deposited is not critical. As an example, five layers of high refractive index material and five layers of low refractive index material may be deposited to form the DBR mirror. A layer of phosphorescent material is then deposited over the DBR mirror. The phosphorescent material has a property to convert the emitted primary light into the secondary light. The type of phosphorescent material utilized will depend on the desired color of the output light, i.e., the peak wavelength of the secondary light. Next, a second layer of transparent material, such as epoxy, is deposited over the layer of phosphorescent material to form a lens of the phosphor-conversion LED.

An advantage of the invention is that the amount of output light generated by the LED is increased due to the configuration of the DBR mirror. As compared to prior uses of filters, the DBR mirror allows an increased amount of primary light to propagate to the phosphorescent layer, thereby increasing the amount of secondary light generated by the phosphorescent layer. Consequently, the amount of output light from the LED is significantly increased.

DETAILED DESCRIPTION

Figure 2:
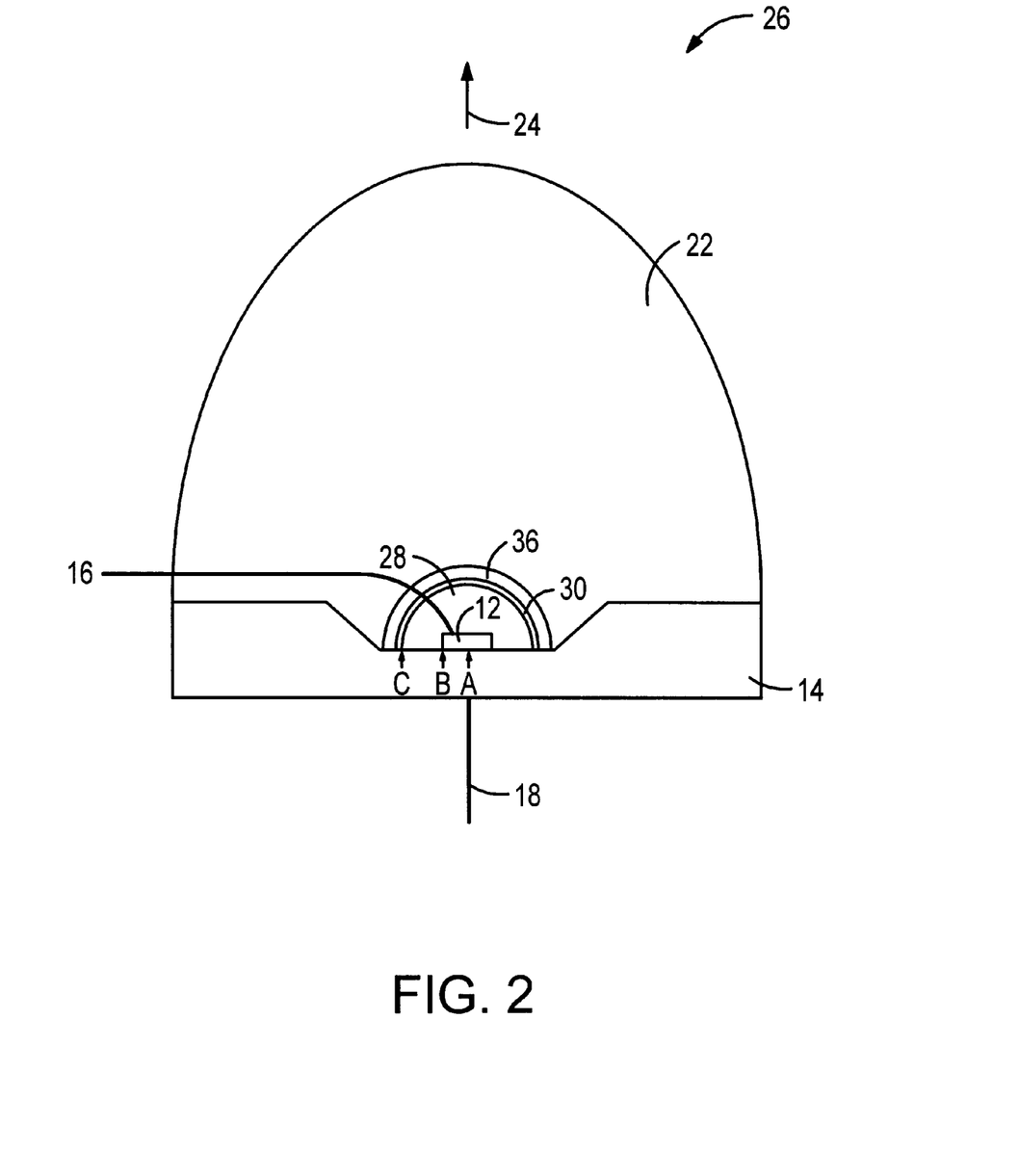
FIG. 2 is a diagram of a phosphor-conversion LED in accordance with the present invention.

With reference to FIG. 2, a phosphor-conversion light emitting diode (LED) 26 in accordance with the present invention is shown. When applicable, the same reference numerals of FIG. 1 will be used for the same components illustrated in FIG. 2. The LED 26 includes the Gallium Nitride (GaN) die 12 that is positioned on the reflector cup lead frame 14 and electrically coupled to the leads 16 and 18. The leads 16 and 18 provide excitation power to the GaN die 12. The GaN die 12 may generally be in a shape of a square. In FIG. 2, the center of the GaN die 12 is indicated by A and the end of the GaN die 12 is indicated by B. In the preferred embodiment, the GaN die 12 is configured to emit primary light having a peak wavelength in the blue region of the light spectrum, i.e., blue light. The GaN die 12 is covered by an encapsulating layer 28 made of a transparent material. The transparent material may be clear epoxy or glass. Preferably, the encapsulating layer 28 is a dome-shaped structure that surrounds the die 12. In the preferred embodiment, the dome-shaped structure is a generally hemispheric structure having a radius that equals the distance from A to C. Preferably, the distance from A to C is equal to or greater than three times the distance from A to B.

Figure 3:
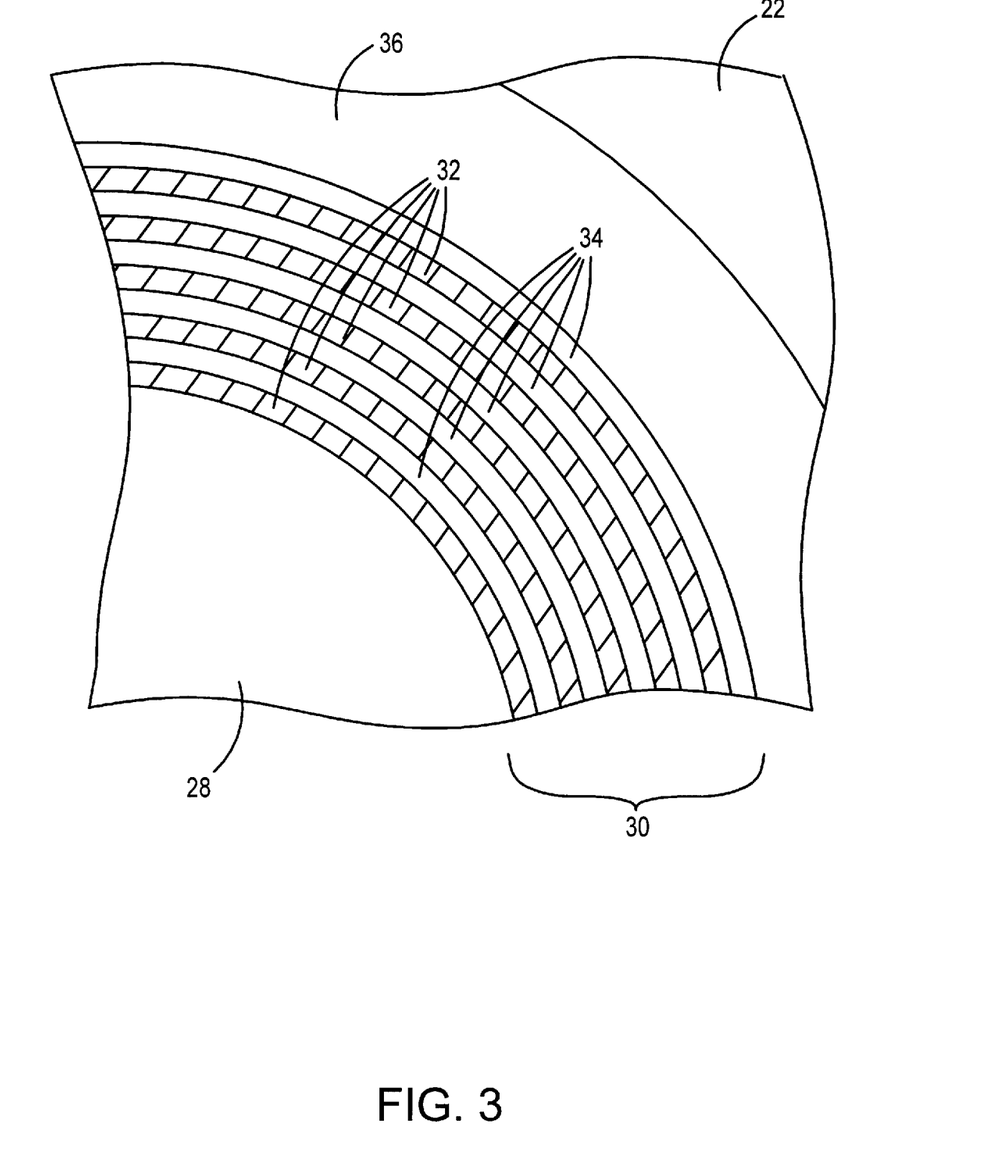
FIG. 3 is a cut-away view of the phosphor-conversion LED of FIG. 2, showing a detailed view of a distributed Bragg reflector (DBR) mirror in accordance with the present invention.

Adjacent to the encapsulating layer 28 is a distributed Bragg reflector (DBR) mirror 30. Because the DBR mirror 30 is formed over the upper surface of the encapsulating layer 28, the DBR mirror 30 is a dome-shaped shell. In the most preferred embodiment, the dome-shaped configuration of the DBR mirror 30 is generally hemispheric. The DBR mirror 30 is made of multiple alternating layers of high and low refractive index materials. A detailed view of a cut-away portion of the LED 26 illustrating the multiple layers of the DBR mirror 30 is shown in FIG. 3. The DBR mirror 30 includes a number of high refractive index layers 32 and a number of low refractive index layers 34. As an example, the high refractive index material may be Titanium Dioxide ($TiO_2$) and the low refractive index material may be Silicon Dioxide ($SiO_2$). Each high refractive index layer 32 and an adjacent low refractive index layer 34 form a pair of high and low refractive index layers. The number of high and low refractive index layers 32 and 34 can vary, depending upon the desired transmittance and reflectance characteristics of the DBR mirror 30. As an example, the DBR mirror 30 may include five pairs of the high and low refractive index layers 32 and 34. Furthermore, the thicknesses of the high and low refractive index layers 32 and 34 can be manipulated to control the transmittance and reflectance characteristics of the DBR mirror 30. The order of the high and low refractive index layers 32 and 34 is not critical to the invention. In FIG. 3, the innermost layer of the DBR mirror 30 is the high refractive index layer 32. In an alternative embodiment, the innermost layer is the low refractive index layer 34.

Returning to FIG. 2, a layer 36 of phosphorescent material is located over the DBR mirror 30. Similar to the DBR mirror 30, the phosphorescent layer 36 may also be a dome-shaped shell. The phosphorescent layer 36 operates to convert the primary light emitted from the GaN die 12 to secondary light through the process of phosphorescence. The phosphorescent material utilized to form the layer 36 will vary, depending upon the desired peak wavelength of the phosphorescently converted secondary light. The GaN die 12, the encapsulating layer 28, the DBR mirror 30 and the phosphorescent layer 36 are encapsulated by the lens 22. The lens 22 is preferably made of a transparent material, such as clear epoxy. However, other transparent materials, such as glass, may be utilized. The transparent material used to form the lens 22 is not critical to the invention.

In operation, the die 12 is activated by electrical power that is supplied to the GaN die 12 via the leads 16 and 18. When activated, the GaN die 12 emits the primary light away from the top surface of the GaN die 12. The emitted primary light propagates through the encapsulating layer 28 toward the DBR mirror 30. The emitted primary light then impinges upon the DBR mirror 30. The DBR mirror 30 allows much of the primary light to be transmitted through the DBR mirror 30 to the phosphorescent layer 36. The amount of primary light transmitted through the DBR mirror 30 depends on the transmittance characteristics of the DBR mirror 30. The transmittance characteristics of the DBR mirror 30 will be described below. The transmitted primary light is then absorbed by the phosphorescent layer 36. The phosphorescent layer 36 emits secondary light in random directions in response to the absorption of the primary light. The amount of primary light converted to the secondary light by the phosphorescent layer 36 will vary, depending on the quantum efficiency of the phosphorescent material utilized to form the phosphorescent layer 36. The quantum efficiency is a measure of the percentage of the transmitted primary light that is converted to the secondary light. The peak wavelength of the secondary light will depend on the type of phosphorescent material utilized to form the layer 36. Some of the secondary light is emitted by the phosphorescent layer 36 in a direction away from the DBR mirror 30. This portion of the secondary light then propagates through the lens 22, exiting the LED 26 as output light. The lens 22 operates to direct the output light in the general direction of the arrow 24.

However, some of the secondary light is emitted back toward the GaN die 12, impinging upon the DBR mirror 30. The DBR mirror 30 reflects much of this secondary light, preventing the secondary light from entering the encapsulating layer 28 and being absorbed by the GaN die 12 or surrounding surfaces. The amount of secondary light reflected by the DBR mirror 30 will depend on the reflectance characteristics of the DBR mirror 30. The reflectance characteristics of the DBR mirror 30 will be described below. The reflected secondary light then propagates through the lens 22, exiting the LED 26 as output light.

The efficiency of the DBR mirror 30 primarily depends on the transmittance and reflectance characteristics of the DBR mirror 30 to transmit the primary light that is propagating away from the GaN die 12 and to reflect the secondary light that is propagating toward the GaN die 12. The transmittance and reflectance characteristics of the DBR mirror 30 are affected by a number of factors. These factors include the halfwidths of the primary light and the secondary light, the number of high and low refractive index layers 32 and 34 included in the DBR mirror 30, and the range of angles incident on the DBR mirror 30 of the primary and secondary light.

In an exemplary embodiment, the DBR mirror 30 includes five pairs of high and low refractive index layers 32 and 34. The high refractive index layers 32 are layers of $TiO_2$, and the low refractive index layers 34 are layers of $SiO_2$. Each layer of $TiO_2$ has a thickness of 61.28 nm, while each layer of SiO$_2$ has a thickness of 99.78 nm. In addition, the GaN die 12 is configured to emit primary light having a peak wavelength of 470 nm. Furthermore, the phosphorescent layer 36 is configured to convert the primary light into secondary light having a peak wavelength of 550 nm. In this exemplary embodiment, the distance from A to C is equal to three times the distance from A to B. Therefore, the DBR mirror 30 has a radius equal to three times the distance from A to B. Consequently, the range of incident angles of the primary light propagating in an outward direction from the GaN die 12 is approximately 20°, as measured at the inner surface of the DBR mirror 30. The 20° angle is the result of the off-center location of substantially all of the originating points for the emitted energy of the primary light. In comparison, the range of incident angles of the secondary light propagating in an inward direction is approximately 170°, as measured at the outer surface of the DBR mirror 30.

Figure 4:
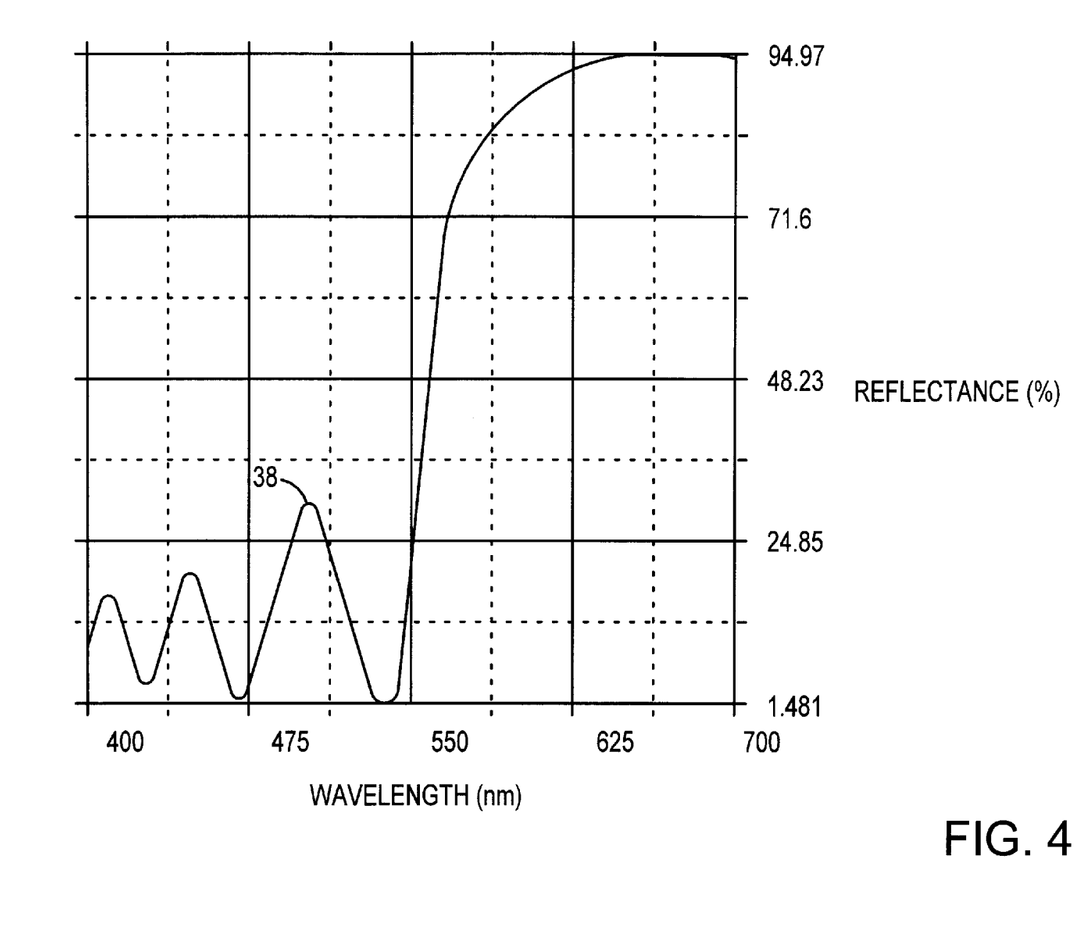
FIG. 4 is a graph showing the reflectance for outwardly propagating light for a DBR mirror of a phosphor-conversion LED in accordance with an exemplary embodiment.

FIG. 4 is a graph of the reflectance of the DBR mirror 30 for outwardly propagating light for a phosphor-conversion LED in accordance with the exemplary embodiment. The reflectance is the percentage of incident light that is reflected by the DBR mirror 30. A curve 38 shows the reflectance for light having a wavelength in the range of 400–700 nm, when the incident angle is cone with half-angles 10°. At approximately 470 nm, the curve 38 has a minimum. The reflectance at 470 nm is in the vicinity of 3%. Conversely, the rate of transmittance at 470 nm is approximately 97%, since the light that is not reflected by the DBR mirror 30 will be transmitted through the DBR mirror. Therefore, the DBR mirror 30 functions as an anti-reflective layer for the emitted primary light. However, since emitted light from the GaN die 12 has a distribution about the peak wavelength, the amount of primary light transmitted by the DBR mirror 30 is actually lower than 97%.

Figure 5:
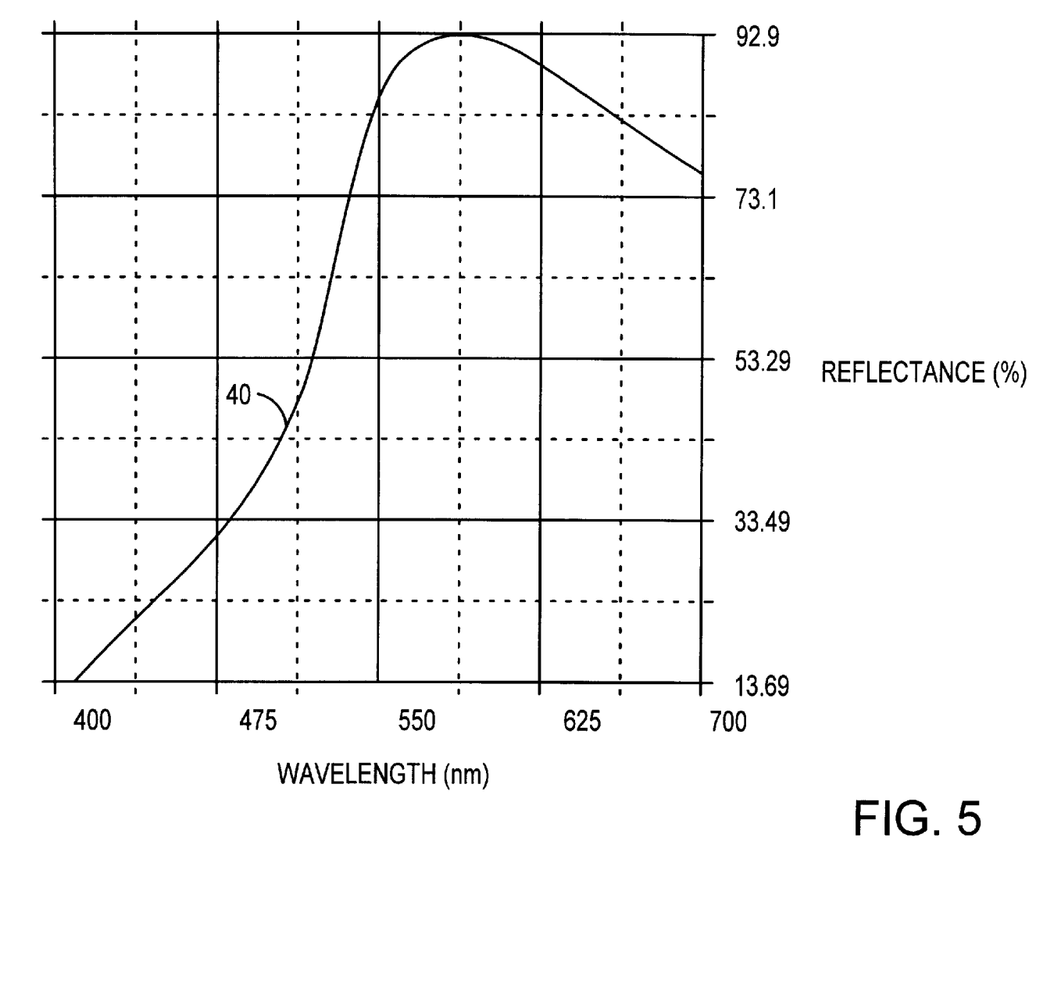
FIG. 5 is a graph showing the reflectance for inwardly propagating light for the DBR mirror of the phosphor-conversion LED in accordance with the exemplary embodiment.

FIG. 5 is a graph of the reflectance of the DBR mirror 30 for inwardly propagating light for the LED in accordance with the exemplary embodiment. A curve 40 shows the reflectance for light having a wavelength in the range of 400–700 nm, when the range of incident angles is a cone with half-angle of 85°. In the exemplary embodiment, the secondary light emitted from the phosphorescent layer 36 has a peak wavelength of 550 nm. At 550 nm, the rate of reflectance is in the vicinity of 85%. Similar to the primary light, the secondary light will also be in a form of a distribution about the peak wavelength. Therefore, the amount of secondary light that is reflected by the DBR mirror 30 will be lower than 85%.

Calculations indicate that when the quantum efficiency of the phosphorescent layer 36 is 90%, the external conversion efficiency of the LED in accordance with the exemplary embodiment is about 71% of the emitted primary light. In comparison, the theoretical maximum efficiency, taking into account that difference between photon energies of the primary light having a peak wavelength of 470 nm and the secondary light having a peak wavelength of 550 nm, is approximately 74% due to the quantum energy deficit. The external conversion efficiency can be increased by increasing the quantum efficiency of the phosphorescent layer 36. The external conversion efficiency can also be increased by increasing the distance between the GaN die 12 and the DBR mirror 30, which would lower the range of incident angles of the outwardly propagating primary light.

Figure 6:
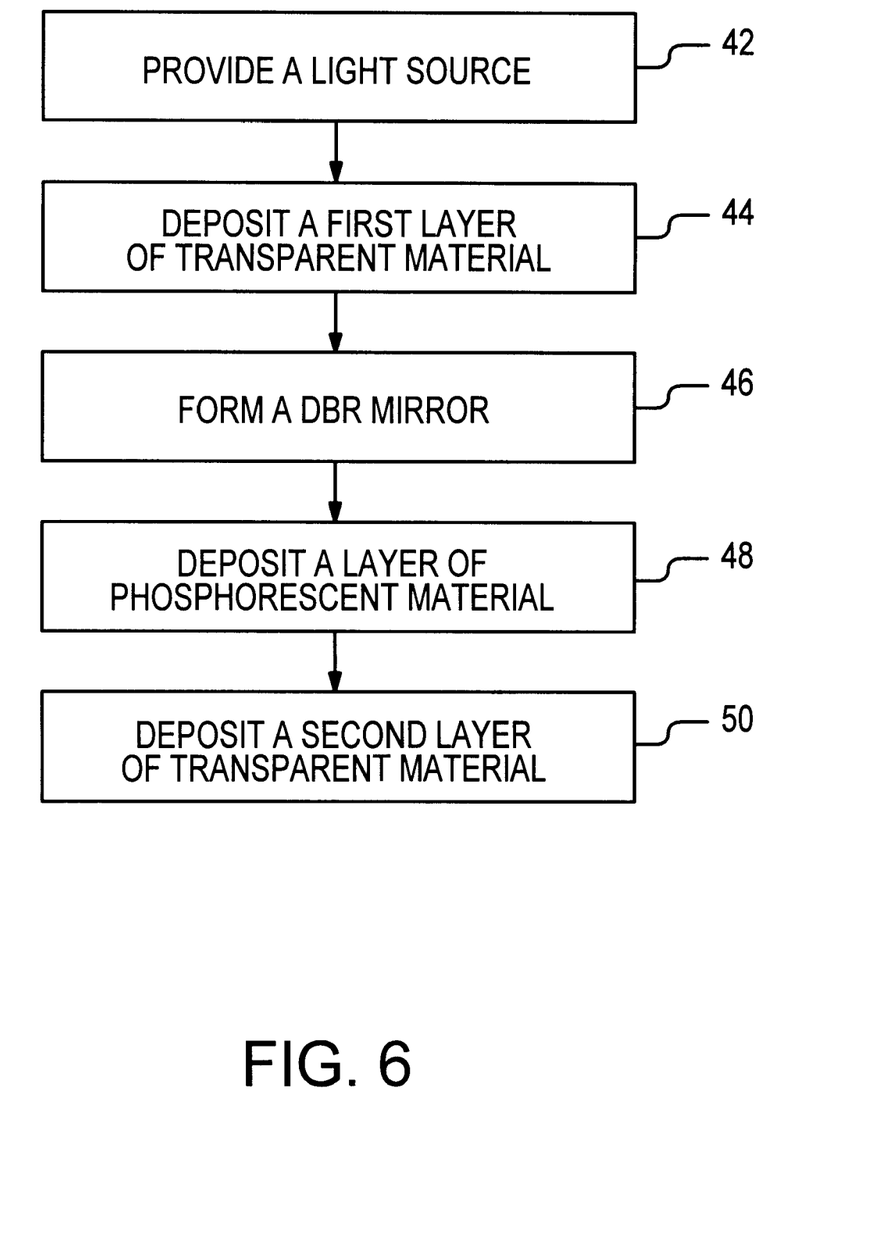
FIG. 6 is a flow diagram of a method of fabricating a phosphorconversion LED in accordance with the present invention.

A method of fabricating a phosphor-conversion LED in accordance with the present invention will be described with reference to FIG. 6. At step 42, a light source is provided that emits primary light having a first peak wavelength. Preferably, the light source is a GaN die that emits blue light.

Next, at step 44, a first layer of transparent material is deposited over the light source. The transparent material may be clear epoxy. In the preferred embodiment, the first layer of transparent material is a dome-shaped structure that encapsulates the light source. After depositing the first layer of transparent material, a distributed Bragg reflector (DBR) mirror is formed over the first layer of transparent material, at step 46. The DBR mirror conforms to the upper surface of the transparent material, forming a shell over the first layer of transparent material. Since the first layer of transparent material is dome-shaped, the DBR mirror also becomes a dome-like shell. In the most preferred embodiment, the dome-shaped configuration of the first layer of transparent material and the DBR mirror is generally hemispherical. The DBR mirror is formed by depositing layers of high and low refractive index materials in an alternating fashion. As an example, the high refractive index material may be Titanium Dioxide (TiO$_2$) and the low refractive index material may be Silicon Dioxide (SiO$_2$). The order in which the layers of high and low refractive index materials are deposited is not critical. As an example, five layers of high refractive index material and five layers of low refractive index material are deposited to form the DBR mirror.

At step 48, a layer of phosphorescent material is deposited over the DBR mirror. The phosphorescent material has a property to convert the emitted primary light into the secondary light. The type of phosphorescent material utilized will depend on the desired color of the output light, i.e., the secondary light. After depositing the layer of phosphorescent material, a second layer of transparent material, such as epoxy, is deposited over the layer of phosphorescent material to form a lens of the phosphor-conversion LED, at step 50.

What is claimed is:

1. A light emitting device comprising:
   a light generator responsive to an excitation signal for emitting first light in a wavelength range having a first peak wavelength;
   a curved wavelength selective reflector that is spaced apart from the light generator by a predetermined distance, said wavelength selective reflector being substantially transmissive with respect to said first light that is propagating in a first direction away from said light generator, said wavelength selective reflector having a curved shape and being positioned to at least partially surround said light generator, said wavelength selective reflector being substantially reflective with respect to second light in a wavelength range having a second peak wavelength that is propagating in a second direction toward said light generator; and
   a wavelength converter fixed at a side of said wavelength selective reflector opposite to said light generator to receive said first light propagating from said wavelength selective reflector in said first direction, said wavelength converter being responsive to said first light to generate said second light having said second peak wavelength.

2. The device of claim 1 wherein said wavelength selective reflector includes a first layer of a first refractive index material and a second layer of a second refractive index material, said first layer and said second layer having a dome shape extending at least partially about said light generator.

3. The device of claim 2 further comprising a dome-shaped structure of a transparent material positioned between said light generator and said wavelength selective reflector to separate said wavelength selective reflector from said light generator by said determined distance, said dome-shaped structure being positioned to at least partially surround said light generator.

4. The device of claim 2 wherein said first refractive index material has a higher refractive index than the refractive index of said second refractive index material, said wavelength selective reflector being hemispheric and having a radius that is at least 1.5 times a lateral dimension of said light generator, said light generator being light-emitting layers on a die.

5. The device of claim 4 wherein said high refractive index material includes Titanium Dioxide (TiO$_2$) and said low refractive index material includes Silicon Dioxide (SiO$_2$).

6. The device of claim 2 wherein said first layer and said second layer at least partially define a distributed Bragg reflector, said distributed Bragg reflector being configured to transmit said first light having said first peak wavelength and to reflect said second light having said second peak wavelength.

7. The device of claim 1 wherein said light generator includes a semiconductor chip that emits said first light in response to said excitation signal, said semiconductor chip having a generally planar light-emitting surface that is spaced apart from said wavelength selective reflector by said predetermined distance.

8. The device of claim 7 wherein said semiconductor chip is a Gallium Nitride (GaN) based chip that emits said first light having said first peak wavelength, said first peak wavelength being in a blue region of a light spectrum.

9. The device of claim 1 wherein said wavelength converter is a layer of a phosphorescent material having a property to convert light energy having said first peak wavelength into light energy having said second peak wavelength.

10. A method of fabricating a light emitting device comprising steps of:

providing a light source that emits first light having a first peak wavelength;

depositing a transparent material over said light source such that said light source is at least partially encapsulated by said transparent material and such that said transparent material has a curved outer surface that is spaced apart from said light source, said transparent material providing a propagation medium for said first light having said first peak wavelength;

forming a wavelength selective reflector over said curved outer surface of said transparent material such that said wavelength selective reflector has a curved inner surface, said wavelength selective reflector configured to transmit said first light having said first peak wavelength and to reflect second light having a second peak wavelength; and depositing a layer of a phosphorescent material over said wavelength selective reflector, said phosphorescent material having a property of converting light energy having said first peak wavelength into light energy having said second peak wavelength.

11. The method of claim 10 wherein said step of depositing said transparent material includes a step of shaping said transparent material into a dome-shaped structure such that said light source is contained within said dome-shaped structure.

12. The method of claim 11 wherein said step of forming said wavelength selective reflector includes sequentially depositing a first refractive index material and a second refractive index material over said dome-shaped structure to form a first refractive index layer and an adjacent second refractive index layer that generally conform to an upper surface of said dome-shaped structure.

13. The method of claim 12 wherein said step of sequentially depositing said first refractive index material and said second refractive index material is a step of sequentially depositing Titanium Dioxide (TiO$_2$) and Silicon Dioxide (SiO$_2$).

14. The method of claim 10 wherein said step of providing said light source is a step of providing a Gallium Nitride (GaN) based chip that emits said first light having said first peak wavelength, said first peak wavelength being in a blue region of a light spectrum.

15. A light emitting device comprising:

a light source responsive to an applied signal to emit first light having a first peak wavelength, said light source including a semiconductor chip and a plurality of layers, said light source having a generally planar outer surface;

a transparent structure positioned over said light source such that said light source is at least partially encapsulated by said transparent structure, said transparent structure having a curved outer surface that is spaced apart from said generally planar outer surface of said light source;

a wavelength selective reflector having a curved inner surface coupled to said curved outer surface of said transparent structure such that said transparent structure is located between said light source and said wavelength selective reflector, said wavelength selective reflector configured to transmit said first light having said first peak wavelength propagating in a first direction away from said light source and to reflect second light having a second peak wavelength propagating in a second direction toward said light source; and a layer of a phosphorescent material positioned over said wavelength selective reflector, said phosphorescent material having a property to absorb said first light having said first peak wavelength and generate said second light having said second peak wavelength.

16. The device of claim 15 wherein said transparent structure is a hemisphere-shaped structure and wherein said wavelength selective reflector is attached to an upper surface of said hemisphere-shaped structure such that said wavelength selective reflector forms a shell over said hemisphere-shaped structure.

17. The device of claim 16 wherein said wavelength selective reflector includes a first layer of a first refractive index material and a second layer of a second refractive index material, each of said first layer and said second layer being a hemisphere-shaped shell.

18. The device of claim 17 wherein said first refractive index material has a higher refractive index than a refractive index of said second refractive index material.

19. The device of claim 17 wherein said wavelength selective reflector includes a distributed Bragg reflector that is at least partially defined by said first layer and said second layer.

20. The device of claim 15 wherein said light source is a Gallium Nitride (GaN) based chip that emits said first light having said first peak wavelength, said first peak wavelength being in a blue region of a light spectrum.

* * * * *